(12) United States Patent
Kengeri et al.

(10) Patent No.: US 8,631,365 B2
(45) Date of Patent: Jan. 14, 2014

(54) MEMORY BUILDING BLOCKS AND MEMORY DESIGN USING AUTOMATIC DESIGN TOOLS

(75) Inventors: Subramani Kengeri, San Jose, CA (US); Chung-Cheng Chou, Hsinchu (TW); Bharath Upputuri, Santa Clara, CA (US); Hank Cheng, Taichung (TW); Ming-Zhang Kuo, Tainan County (TW); Pey-Huey Chen, Baoshan Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/461,571

(22) Filed: May 1, 2012

(65) Prior Publication Data

US 2012/0213013 A1 Aug. 23, 2012

Related U.S. Application Data

(63) Continuation of application No. 12/825,960, filed on Jun. 29, 2010, now Pat. No. 8,185,851.

(60) Provisional application No. 61/233,368, filed on Aug. 12, 2009.

(51) Int. Cl.
*G06F 9/45* (2006.01)

(52) U.S. Cl.
USPC ............ 716/103; 716/101; 716/106; 716/107; 716/108; 716/131; 716/132; 716/139; 365/189.011

(58) Field of Classification Search
USPC .......... 716/101, 103, 106, 107, 108, 131, 132
See application file for complete search history.

(56) References Cited

U.S. PATENT DOCUMENTS

| | | | | |
|---|---|---|---|---|
| 5,555,215 | A * | 9/1996 | Nakagome et al. | 365/226 |
| 5,991,522 | A * | 11/1999 | Shoen | 716/103 |
| 6,216,205 | B1 * | 4/2001 | Chin et al. | 711/131 |
| 6,393,600 | B1 * | 5/2002 | Sribhashyam et al. | 365/189.05 |
| 6,507,828 | B1 * | 1/2003 | Leonard et al. | 706/33 |
| 6,687,686 | B1 * | 2/2004 | Nervegna et al. | 706/15 |
| 7,028,271 | B2 * | 4/2006 | Matsugu et al. | 716/107 |
| 7,143,367 | B2 * | 11/2006 | Eng | 716/102 |
| 7,783,995 | B2 * | 8/2010 | Joshi | 716/103 |
| 2003/0202405 | A1 | 10/2003 | Shau | 365/200 |
| 2004/0117744 | A1 * | 6/2004 | Nation et al. | 716/1 |
| 2004/0139040 | A1 * | 7/2004 | Nervegna et al. | 706/15 |
| 2005/0102572 | A1 * | 5/2005 | Oberlaender | 714/29 |
| 2005/0133852 | A1 * | 6/2005 | Shau | 257/315 |
| 2006/0098469 | A1 * | 5/2006 | Yang et al. | 365/63 |
| 2006/0107247 | A1 * | 5/2006 | Andreev et al. | 716/11 |
| 2009/0262564 | A1 * | 10/2009 | Yang et al. | 365/51 |
| 2011/0093668 | A1 * | 4/2011 | Lowrey | 711/154 |
| 2011/0286271 | A1 * | 11/2011 | Chen | 365/185.09 |

\* cited by examiner

*Primary Examiner* — Vuthe Siek
*Assistant Examiner* — Brian Ngo
(74) *Attorney, Agent, or Firm* — Lowe Hauptman & Ham, LLP

(57) ABSTRACT

The memory building blocks can be used in conjunction with ASIC automatic design tools to generate a memory macro (e.g., a memory array) using a known ASIC design flow including, for example, register transfer level (RTL), synthesis, automatic place and route (APR) and timing analysis.

20 Claims, 12 Drawing Sheets

300

| | INPUT | | | OUTPUT | |
|---|---|---|---|---|---|
| | RWL | WWL/ WWLB | WD WBL/WBLB | NODE2/ NODE1 | RBL |
| 1 | 0 | 1/0 | 1/0 | 0/1 | 1 |
| 2 | 0 | 1/0 | 0/1 | 1/0 | 1 |
| 3 | 1 | 0/1 | X | 0/1 | 1 |
| 4 | 1 | 0/1 | X | 1/0 | 0 |

MEMORY BUILDING BLOCKS AND MEMORY DESIGN USING AUTOMATIC DESIGN TOOLS

CROSS-REFERENCE TO RELATED APPLICATIONS

The present application is a Continuation of U.S. application Ser. No. 12/825,960, filed Jun. 29, 2010, which in turn claims the priority of U.S. Provisional Patent Application Ser. No. 61/233,368 filed on Aug. 12, 2009 which are incorporated herein by reference in their entireties.

FIELD

The present disclosure is generally related to memory. In various embodiments memory elements are created to be part of a library and can be used with ASIC design tools to automatically design a memory (e.g., a memory array).

BACKGROUND

Traditional memory design is generally involved with manual schematic and/or layout, which is time consuming. In a memory design approach using compilers, the control circuit is mostly based on a pre-defined design making it specific and inflexible. The memory interface is generally fixed, and, in many situations, only the memory size and the IO number in a design are changeable. Current ASIC standard cells can serve some specific applications not related to memory design. Current ASIC automatic design tools using ASIC standard cells are generally built to work with digital circuits, logic gate circuits, etc.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

FIG. 3 shows a truth table for the memory cell in FIG. 2.

Like reference symbols in the various drawings indicate like elements.

DETAILED DESCRIPTION

Figure 1:
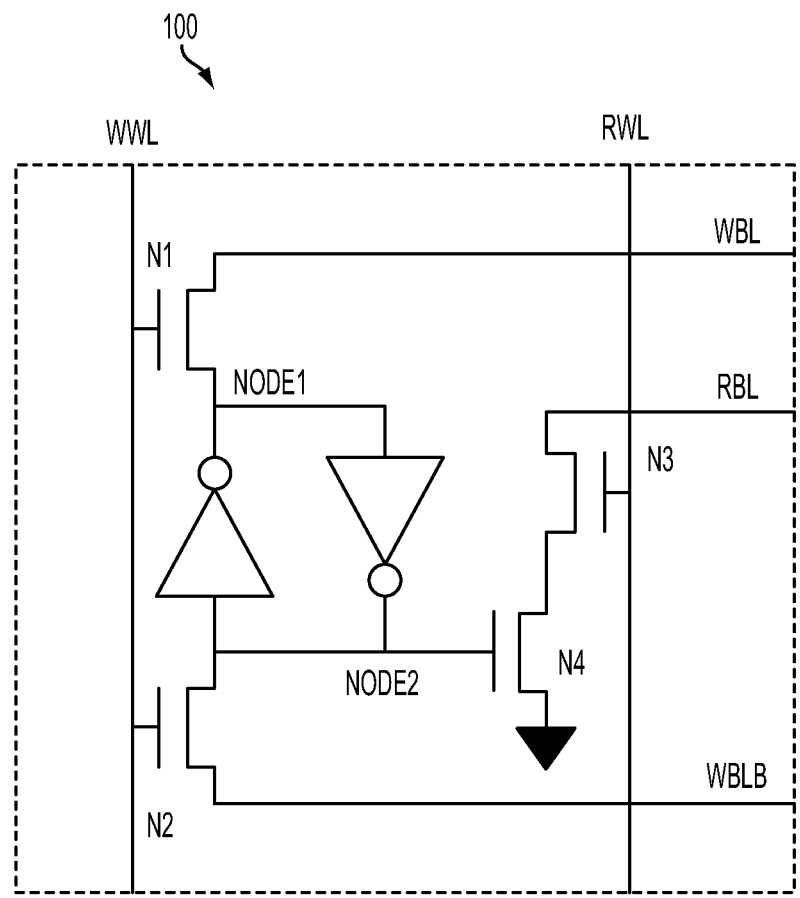
FIG. 1 shows a memory cell in accordance with an embodiment of the disclosure.

Various embodiments, or examples, of the disclosure illustrated in the drawings are described using specific language. It will nevertheless be understood that no limitation of the scope of the invention is thereby intended. Any alterations and modifications in the described embodiments, and any further applications of principles of the disclosure described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

Various embodiments can have one or a combination of the following features and/or advantages. Some embodiments provide memory building blocks based on which and in conjunction with conventional ASIC design tools a memory (e.g., memory array) can be automatically generated. For example, in some embodiments, with a predefined memory floor plan and user specified synthesis timing specification, the designer can generate a memory physical layout based on user specified timing specification. As compared to traditional manual memory design and layout, some embodiments greatly reduce layout effort and design turn-around time, enabling opportunities for mass production. The memory control circuit in various embodiments is more flexible because it can be programmed.

The Building Block

FIG. 1 shows an exemplary data storage unit or memory cell 100 upon which embodiments of the disclosure may be implemented. Memory cell 100 is a conventional 8T (8-transistor) memory cell.

Inputs of memory cell 100 include signals WWL, WBL, WBLB, and RWL. Output of memory cell 100 include signal RBL. Transistors N1, N2, and N3 receive as inputs signals WWL, WBL, WBLB, and RWL while transistor N3 provides as output signal RBL. Those skilled in the art will recognize that transistors N1, N2, and N3 may be referred to as analog devices, and, as a result, memory cell 100 may be referred to as having an analog interface because memory cell 100 interfaces with other circuitry through these analog devices N1, N2, and N3.

To write to memory cell 100, signal (e.g., write word line) WWL is activated (e.g., high) so that data placed at signals WBL and WBLB are written into nodes Node1 and Node2 respectively. Before reading data at signal (e.g., read bit line) RBL, this signal RBL is pre-charged to a high. To read data from memory cell 100 signal RWL is activated (e.g., high), which turns on transistor N3. If memory cell 100 stores a low at node Node1, memory cell 100, by operation of a memory cell, stores a high at node Node2. Because Node2 is high, transistor N4 is on. As a result, data at signal RBL is low. If memory cell 100 stores a high at node Node1, it also stores a low at Node2. Because node Node2 is low, transistor N4 is off, the data at signal RBL is high due to the pre-charge before reading.

Various embodiments of the disclosure convert memory cell 100 to memory cell 200 (e.g., FIG. 2 below) so that memory cell 200 is compatible with a standard ASIC cell ("standard cell"). In various embodiments, an STA (static timing analysis) does not recognize the pitch format of memory cell 100, but recognizes the pitch format of memory cell 200. As a result, memory cell 200 is STA friendly, including capabilities to be viewed by the STA tool and therefore may be used in an automatic ASIC design flow to automatically create a memory array. Various embodiments of the disclosure in effect convert the analog nature of memory cell 100 to a digital nature of the standard ASIC cell. For example, embodiments, where appropriate, convert each function in memory cell 100 (e.g., write, read, etc.) to a logic function, such as a NAND, an AND, a NOR, an OR, a pass gate, etc., based on which a truth table may be built. As a result, the interface of memory cell 200 is digital while its internal function remains the same as memory cell 100. Reviewing the truth table of memory cell 200 (e.g., table 300 of FIG. 3), those skilled in the art can consider memory cell 200 as a register. As a result, ASIC design tools including synthesizable capabilities can recognize memory cell 200.

Figure 2:
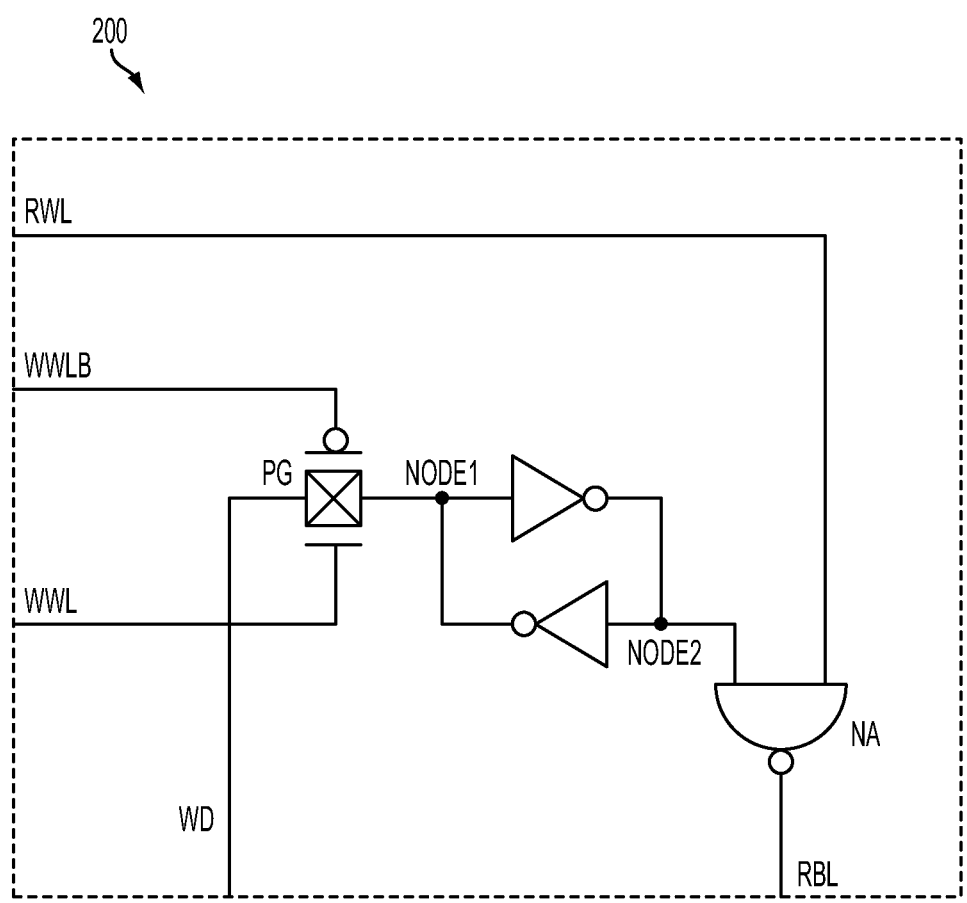
FIG. 2 shows a memory cell converted from the memory cell of FIG. 1 and serves as a building block for memory design in accordance with an embodiment.

FIG. 2 shows a memory cell 200 in accordance with an embodiment. Memory cell 200 may be referred to as a register. Pin-wise or viewing at the logic function memory cell 100 and memory cell 200 are compatible, i.e., perform the same function. Inputs to memory cell 200 include signals RWL, WWL, WWLB and WD while outputs from memory cell 200 include signal RBL. Pass gate PG and NAND gate NA receive as inputs signals WWL, WWLB, WD, and RWL while NAND gate NA provides as output signal RBL. Those skilled in the art will recognize that memory cell 200 may be referred to as having a digital interface because memory cell 200 interfaces with other circuitry through these digital pass gate PG and NAND gate NA. Memory cell 200, however, remains its writing function through signals WWLB, WWL, and WD, and its reading function through signals RWL and RBL.

As compared to memory cell 100, signal WWL of cell 100 has been converted to signals WWL and WWLB, which control pass gate PG. Signals WBL and WBLB have been converted to signal WD. To write to memory cell 200, data is placed at signal WD, and pass gate PG, in conjunction with signals WWLB and WWL, allows that data to be transferred to node Node1 (and node Node2) as appropriate. Reading from memory cell 200 or detecting the logic level at signal RBL depends on the logic state of read word line RWL and the data stored at node Node2. If node Node2 stores a high, and if signal RWL is high then signal RBL, passing through the NAND gate NA, is low. If node Node2 stores a low, then, regardless of the status of signal RWL, signal RBL is high.

FIG. 3 shows a truth table 300 illustrating the logic function of memory cell 100 and 200. Inputs of table 300 include signals RWL, WWL/WWLB, WD or WBL/WBLB). Outputs of table 300 include the content of node Node2/Node1. Outputs of table 300 are compatible to the data read from memory cell 200 (e.g., the data detected at signal RBL).

On rows 1 and 3, because node Node2 stores a low, signal RBL is high based on operation of NAND gate NA. On row 2 because signal RWL is low, signal RBL is high, based on operation of NAND gate NA. On row 4 when signal RWL is high and node Node2 stores a high signal RBL is low. From another perspective, when signal RWL is high for reading signals WBL and WBLB do not have any effect on signal RBL. Those skilled in the art will recognize that truth table 300 of memory cell 200 provides the writing and reading function of memory cell 100.

Memory cell 100 and memory cell 200 are used for illustration only, other data storage units are within scope of embodiments of the disclosure, i.e., they can be converted to conform the format recognized by automatic ASIC design tools. Examples of those data storage units include SRAM bit cell (e.g., 6T, 8T), multi-port bit cell (2R1W (2 read port, 1 write port), 2R2W (2 read port, 2 write port), 4R2W (4 read port, 2 write port)), etc.

Figure 4:
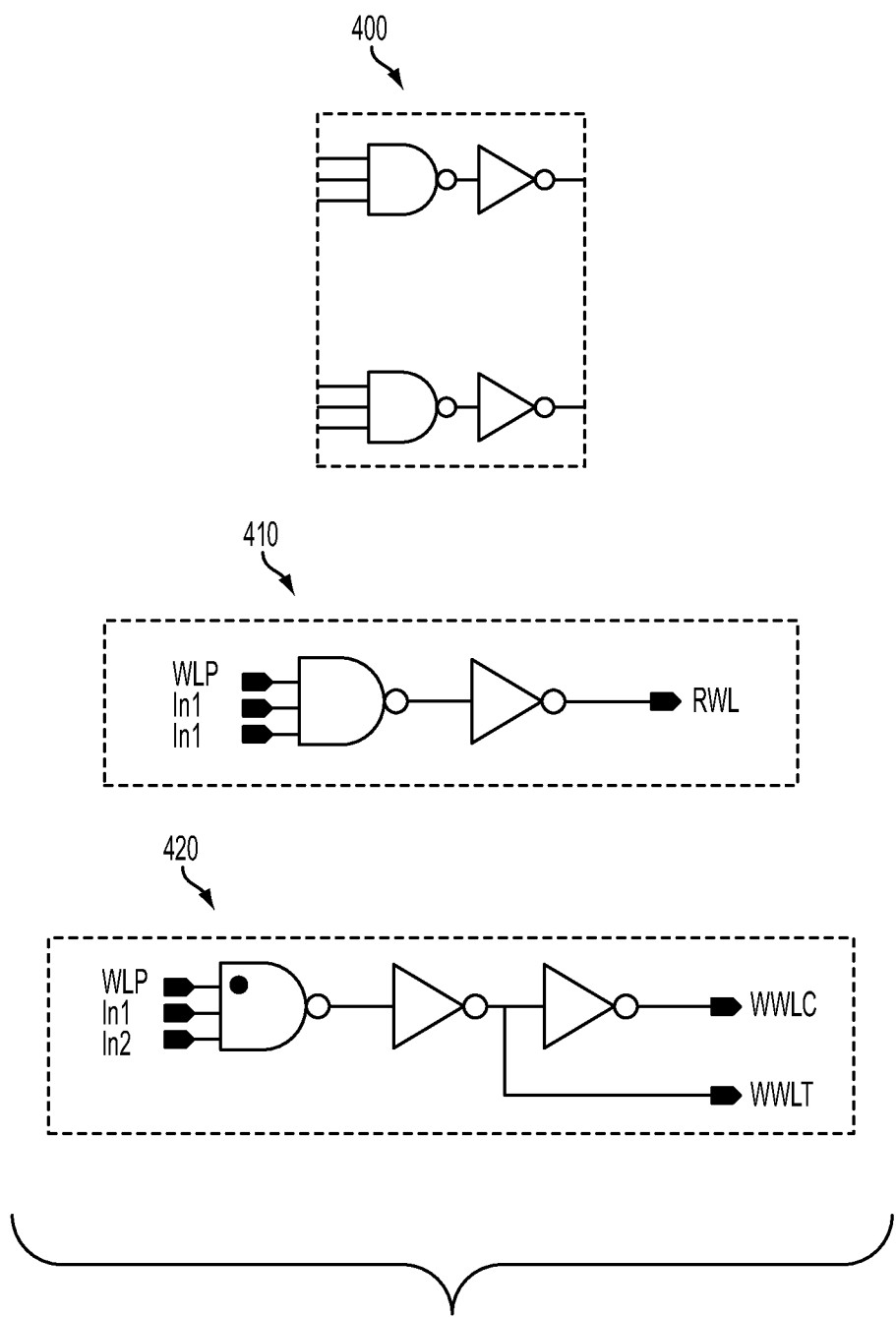
FIG. 4 shows a data select unit including a read word line driver and a write word line driver in accordance with an embodiment.

FIG. 4 shows an exemplary data select unit 400 converted to be recognized by the ASIC automatic design tool, in accordance with an embodiment. Depending on applications, data select unit 400 may include a read word line driver RWLD 410, a write word line drive WWLD 420, etc. The logical function of data select unit 400 including a word line drive (e.g., a read word line driver or a write word line driver) is self explanatory to a person skilled in the art and is not described in this document. As explained below, various embodiments of the disclosure provide timing arcs for a read word line driver RWLD 410 and a write word line driver WWLD 420 as appropriate.

Figure 5:
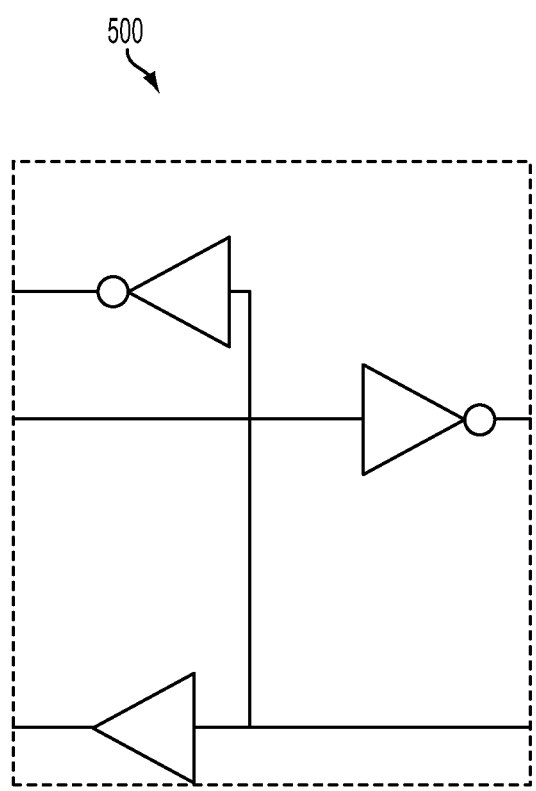
FIG. 5 shows a data IO unit in accordance with an embodiment.

FIG. 5 shows an exemplary data IO unit 500 converted to be recognized by the ASIC automatic design tool, in accordance with an embodiment. The logical function of data IO unit is self explanatory to a person skilled in the art and is not described in this document. Depending on application, data IO unit 500 may be chosen as an inverter, a NAND gate, a sense amplifier, a write buffer, a pre-charger, etc.

In various embodiments of the disclosure data storage unit 200, data select unit 400, and data IO unit 500 are created as part a design library such that they can be used in conjunction with ASIC design tools to automatically create a memory. For illustration and simplicity, each of a data storage unit 200, a data select unit 400, and a data IO unit 500 may be referred to as a "standard" memory element, a synthesizable building block, a library design cell, or the like because they conform to the standard of the ASIC design tools. The term building block indicates that a memory or memory array may be built from a combination of blocks or memory cell 200, data select units 400 and data IO units 500. The term "synthesizable" indicates that the building blocks may be used with ASIC automatic design tools having synthesis analysis capabilities.

Timing Arcs

In various situations, whether some data is valid depends on the timing relationship between the related signals. Such timing relationship may be expressed in timing arcs or timing paths wherein a timing path comprises a plurality of timing arcs. Various embodiments of the disclosure provide various timing arcs for the building blocks to be recognized by the STA tool. Various embodiments determine where timing relationship between related signals is required and generate the timing arcs. Depending on applications, various embodiments consider setup and hold time. Setup is the time a first signal (e.g., data) is expected to be available before a second signal (e.g., write signal) is asserted, and hold time is the time the first signal (e.g., data) is expected to remain valid once the first signal (e.g., write signal) is asserted. With respect to outputs, timing relationship exists between clock signals to outputs, i.e., the time it takes from the time a clock signal is asserted to the time data is available at an output. Various embodiments provide a delay timing arc between the clock and the output signals. Where signals are passing through, various embodiments provide delay timing arcs from an input to an output.

Figure 6:
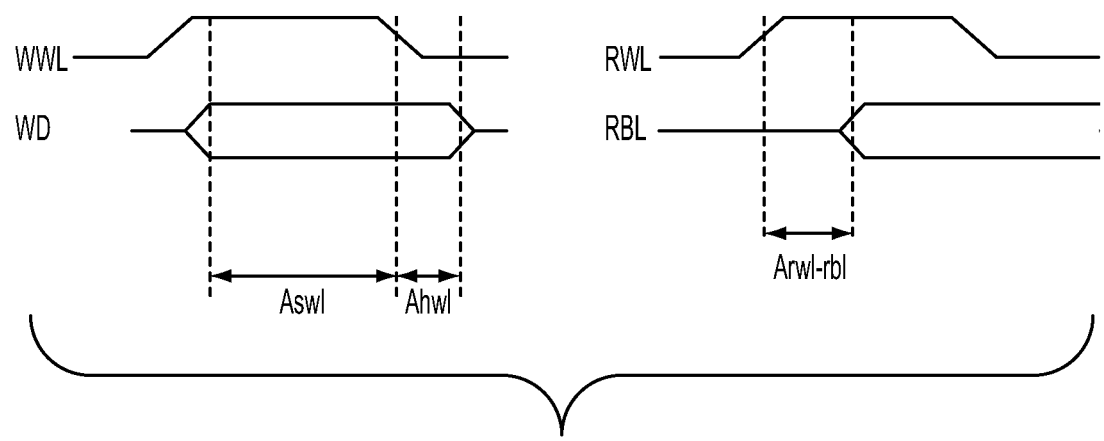
FIG. 6 shows waveforms illustrating timing arcs for the memory cell of FIG. 2 in accordance with an embodiment.

FIG. 6 shows waveforms illustrating various timing arcs for memory cell 200. For illustration purposes, only timing arcs related to signal WWL are shown, but timing arcs related to signal WWLB can be similarly created. Timing arcs shown in FIG. 6 include setup timing arc Aswl and hold timing arc Ahwl. Timing arc Aswl is the time signal (e.g., data) WD is expected to be available before signal WWL is activated while timing arc Ahwl is the time data WD is expected to remain valid once signal WWL is activated so that valid data maybe be written to nodes Node1 and Node2. Timing arc Arwl-rbl indicates the time it takes for data stored at node Node2 to be available at signal RBL after signal RWL is asserted.

Figure 7:
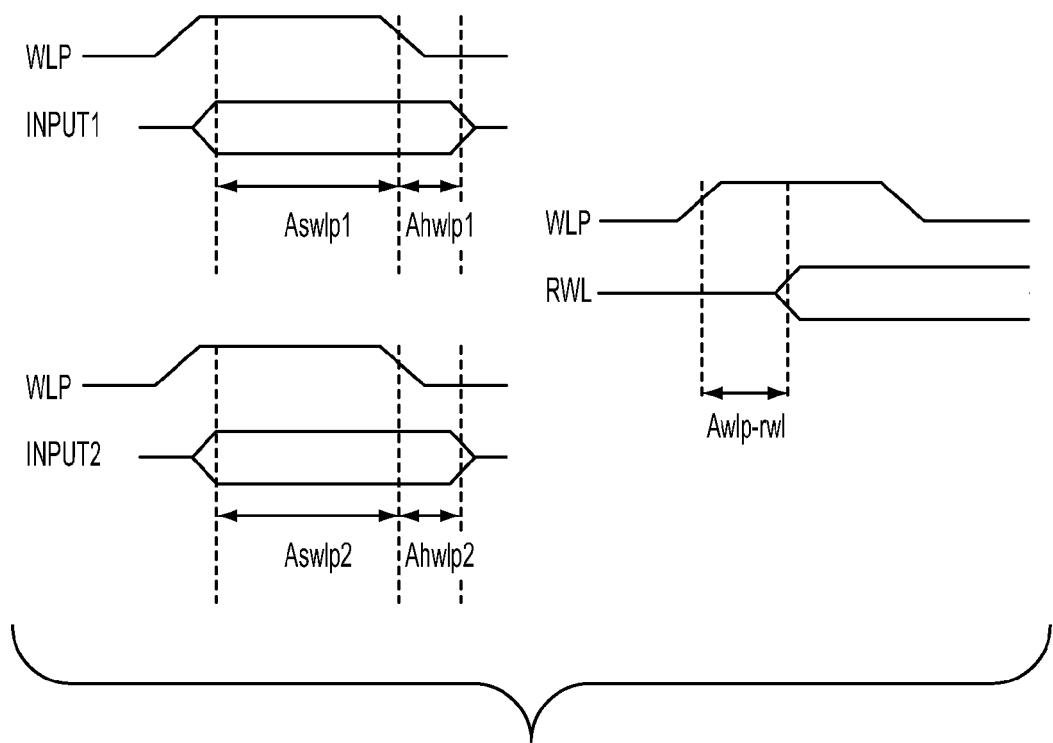
FIG. 7 shows waveforms illustrating timing arcs related to a read word line driver of FIG. 4, in accordance with an embodiment.

FIG. 7 shows waveforms illustrating timing arcs related to read word line driver RWLD 410. Various embodiments of the disclosure consider signal WLP as a clock and provide setup and hold timing arc with respect to signals Input1 and Input2. These timing arcs include Aswlp1, Ahwlp1, Aswlp2 and Ahwlp2. Timing arc Aswlp1 is the time signal Input1 is expected to be available before signal WLP is asserted and timing arc Ahwlp1 is the time signal Input1 is expected to remain valid once signal WLP is asserted. Similarly, timing arc Aswlp2 is the time signal Input2 is expected to be available before signal WLP is asserted and timing arc Ahwlp2 is the time signal Input2 is expected to remain valid once signal WLP is asserted. Read word line driver RWLD 410 also includes timing arc Awlp-rwl, which is the time delay once signal WLP is asserted until signal Input1 or signal Input2 is available at output RWL.

Figure 8:
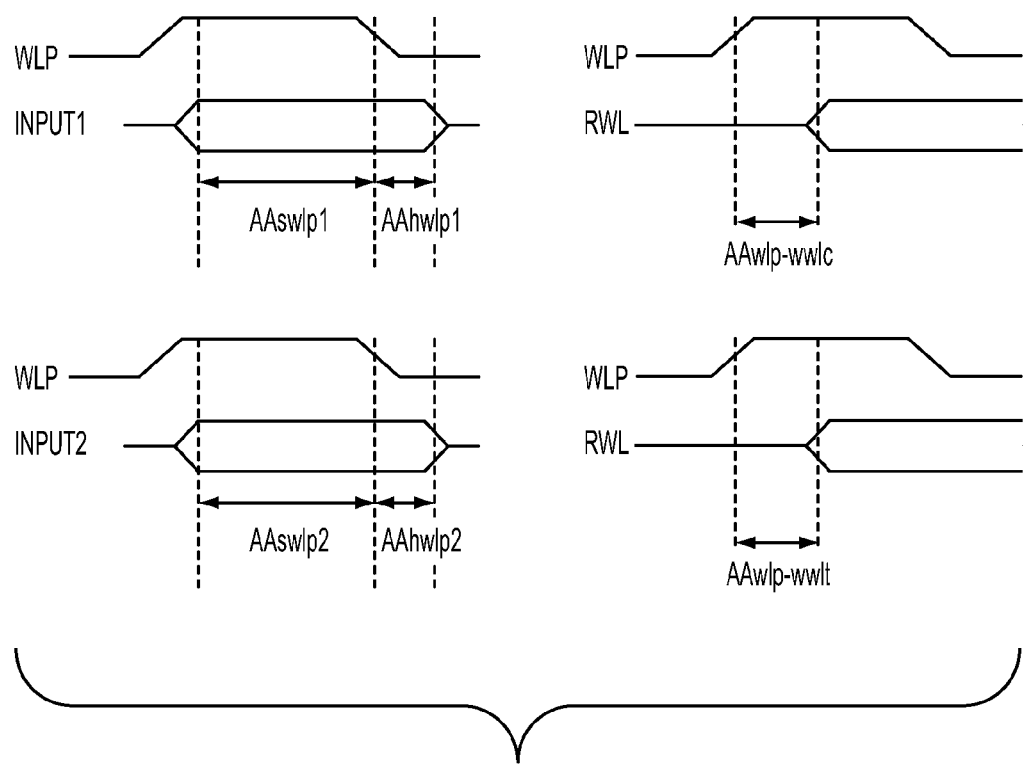
FIG. 8 shows waveforms illustrating timing arcs related to a write word line driver of FIG. 4, in accordance with an embodiment.

FIG. 8 shows waveforms illustrating timing arcs related to write word line driver WWLD 420. Similar to read word line driver RWLD 410 various embodiments consider signal WLP as a clock and provide setup and hold timing arc with respect to signals IInput1 and IInput2. These timing arcs include timing arcs AAswlp1, AAhwlp1, AAswlp2 and AAhwlp2. Timing arc AAswlp1 is the time signal IInput1 is expected to be available before signal WLP is asserted and timing arc AAhwlp1 is the time signal IInput1 is expected to remain valid once signal WLP is asserted. Similarly, timing arc AAswlp2 is the time signal IInput2 is expected to be available before signal WLP is asserted and timing arc AAhwlp2 is the time signal IInput2 is expected to remain valid once signal WLP is asserted. Write word line driver WWLD 420 also includes timing arcs AAwlp-wwlc and AAwlp-wwlt. Timing arc AAwlp-wwlc is the time delay once signal WLP is asserted until signal IInput1 or signal IInput2 is available at output WWLC, and timing arc AAwlp-wwlt is the delay time once signal WLP is asserted until signal IInput1 or signal IInput2 is available at output WWLT.

Metal Routing Pitch for the Building Block

In various embodiments of the disclosure, the building blocks (e.g., each of the memory cell 200, data select unit 400, and IO select unit 500) conform to the format of a standard ASIC cell. That is, the metal routing pitch (commonly referred to as the pitch, the layout pitch, etc) of the building blocks is compatible to that of the standard cell. As a result, the layout pitch of memory call 200, data select unit 400, and data IO unit 500 are recognizable by the synthesis and the automatic place and route tools. For illustration purposes, the pitch of a standard cell is referred to as a standard pitch, which includes a metal line and a spacer, and may be referred to as a track. The size of a standard pitch or track varies depending on technologies.

Depending on applications, various embodiments may conform to the height pitch, the width pitch or a combination of the height and width pitch of the standard pitch. In an embodiment, the pitch of a building block is the same as or a multiple of the standard pitch. For example, if a standard cell uses 9, 12, or 15 tracks, then various embodiments use the same 9, 12, or 15 tracks or a multiple of these 9, 12, or 15 tracks for the building blocks. The layout size of a building block or the number of tracks or pitch per building block may be determined based on the number of transistors per building block and the size of the transistors constituting the building block.

Using the design pitch guidelines for a particular technology, an engineer (e.g., a layout engineer) does his/her best to configure (e.g., fit) a building block into a layout area having the smallest standard pitch that could fit the block. If the building block does not fit in this smallest standard pitch, the layout engineer may increase the pitch size. For example, with an initial try a building block may take 3-standard pitch. If the building block fits in this 3-standard pitch, the layout engineer uses it, but if it does not fit, then the layout engineer would try to fit it in a cell of 4-standard-pitch, 5-standard-pitch, etc. While selecting a pitch for a building block, the layout engineer also considers performance of the building block and adjusts the pitch selection as appropriate. For example, a building block may physically fit in a smaller-cell pitch (e.g., a 3-standard pitch), but performance may be degraded. In such a situation, the layout engineer may consider a larger cell pitch (e.g., a 4-standard pitch, a 5-standard pitch, etc.).

In various embodiments, to save layout area, multiple building blocks are configured to conform to the standard cell format. For example, if a standard cell format takes 9 tracks, and a building block (e.g., a storage unit) takes 13 tracks, various embodiments would configure two storage units taking 26 tracks to fit in 3 multiples of 9 tracks (e.g., 27 tracks). Individually, each storage unit would take 18 tracks to fit the 13 tracks of the storage unit, and two storage units would take 36 tracks. As can be seen, various embodiments use only 27 tracks for a saving of 9 tracks (36 tracks–27 tracks).

Similarly, to also save layout area, various embodiments can combine different building blocks and/or other logic circuits to conform to the standard cell format. That is, multiple or a combination of storage units 200, select units 400, and/or IO units 500 are configured to fit in 9, 12, or 15 tracks or a multiple of these 9, 12, or 15 tracks, using the above example.

In various embodiments of the disclosure, the layout pitches of the building blocks (e.g., a memory cell 200, a data select unit 400, or a data IO unit 500) are related. This pitch relationship is based on potential configurations of a memory array (e.g., memory array 900) to be designed, including, for example, the relative position of one building block to another building block, the direction (e.g., a column or row direction) that a building block may be placed next to another building block, the size of a first building block relative to a second building block, etc. In an embodiment, because a memory cell 200 abuts a read word line driver RWLD 410 and a write word line driver WWLD 420 in a Y-direction, the pitch relationship is based on the X-direction. Further, considering a given height for a word line driver (e.g., a read word line driver RWLD 410 or a write word line driver WWLD 420), various embodiments provide a memory cell 200 having a pitch width twice that of a word line driver. Similarly, because a memory cell 200 abuts a data IO unit 500 in the X-direction, the pitch relationship is based on the Y-direction wherein the Y-pitch of memory cell 200 is twice that of a data IO unit 500.

Once the building blocks in accordance with various embodiments of the disclosure are generated in compliance with the standard cell pitch rules, different memories (e.g., memory arrays, memory macros) with different configurations can be created based on these building blocks using the known RTL, circuit synthesis, automatic place and route and STA tools.

Exemplary Memory Array

Figure 9:
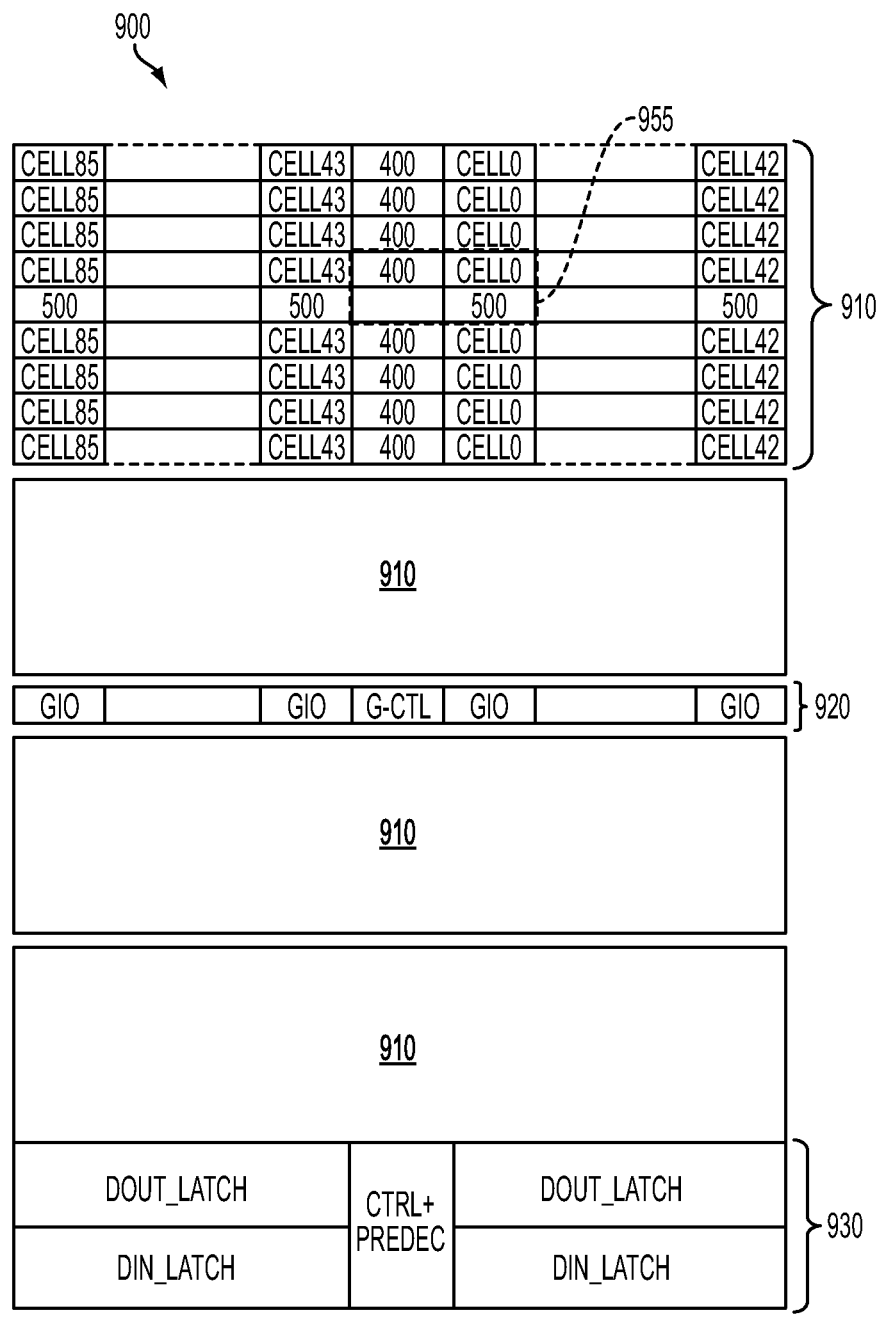
FIG. 9 shows a memory array generated from building blocks in accordance with an embodiment.

FIG. 9 shows a memory array 900 generated in accordance with an embodiment of the disclosure. Memory array 900 includes a plurality of sub-arrays 910, global IO and global control 920, IO latches (Din_latches, Dout_latches) and address pre-decoding circuit 930. The size of memory array 900 varies depending on various factors including design choice, need, technology, etc.

Each of a sub array 910 includes a plurality of memory cells 200, a plurality of data select units 400 and a plurality of data IO units 500. For illustration purposes, detail of only one sub array 910 is shown. Further, a sub array 910 includes 8 columns of memory cells 200 and a column of data IO units 500. A column may be referred to as a word. A memory column includes 86 memory cells 200 and a data select unit 400. From another perspective, sub array 910 includes a row of data select units 400. In FIG. 900, the row of data select units 400 is in the middle of the memory cell column so that resistance and capacitance effect on the units can be minimized. For example, the longest distance from a data select unit 400 to a farthest memory cell 200 and thus capacitance and/or resistance effect is at most ½ of the column. Various embodiments of the disclosure, however, are not limited to such a configuration. The row of data select units 400 could be at different locations in the column, including the two edges, for example.

Figure 10:
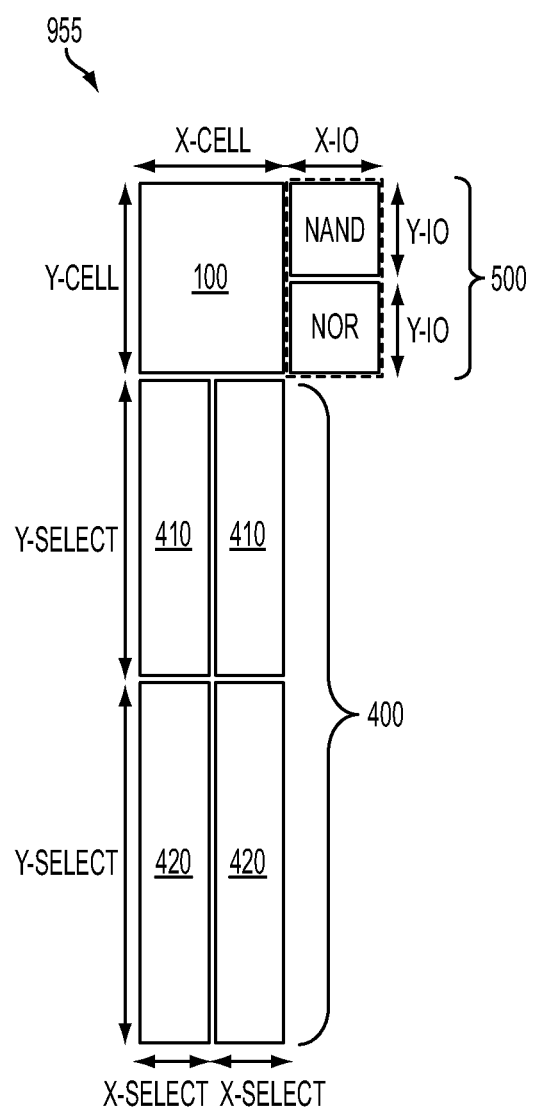
FIG. 10 shows in detail a portion of the memory array in FIG. 9.

FIG. 10 shows a detail of portion 955 of a sub array 910 that includes a memory cell 200 abutting a data select unit 400 (to the bottom) and a data IO unit 500 (to the right). A data select unit 400 in FIG. 10 includes two read word lines 410 and two write word lines 420 while a data IO unit 500 includes a NAND and a NOR gate.

For illustration purposes, the metal pitch of a building block (e.g., a memory cell 200, a data select unit 400, a data IO unit 500, etc.) includes a width pitch (e.g., X-direction or X-pitch, or row direction) and a height pitch (e.g., Y-direction or Y-pitch or column direction). Further, the X-direction pitch of a memory cell 200, a data select unit 400, a data IO unit 500, a global IO, and a global control may be referred to as pitch X-cell, pitch X-select, pitch X-IO, pitch X-GIO, pitch X-GCTL, respectively. Similarly, the Y-direction pitch of a memory cell 200, a data select unit 400, a data IO unit 500, a global IO, and a global control GIO may be referred to as pitch Y-cell, pitch Y-IO, pitch Y-select, pitch Y-GIO, and pitch Y-GCTL, respectively. The X-direction and Y-direction pitch of a standard cell may be referred to as pitch X-standard and pitch Y-standard.

Depending on configuration of memory array 900 (e.g., as selected by a designer), the layout pitch of a building block is related to the pitch of another building block, of the global IO and global control 920, of the IO latches and address pre-decoding circuit 930. As a result, based on the desired configuration of memory array 900 before a memory array is generated, the X- and Y-pitch of each building block 200, 400, and 500, and of the global IO and global control 920, of the IO latches and address pre-decoding circuit 930 relative to one another may be determined. For example, in the embodiment of FIG. 900, the X- and Y-pitch of a memory cell 200, a data select unit 400, and a data IO unit 500 are a multiple of the X- and Y-pitch of a standard cell. Further, the X-pitch of a memory cell 200 (e.g., X-cell) is twice the X-pitch of a data select unit (e.g., X-select). Further, the Y-pitch of a memory cell 200 is twice the Y-pitch of the data IO unit 500. The above example is only for illustration, embodiments are not limited to the above pitch relationship between the building blocks. A designer may select the pitch relationship depending on design choice, technologies, the size of the relevant building blocks, the location of the building blocks with respect to one another, etc. For example, the X-pitch of a memory cell 200 may be 3, 4, 5, etc., times that of the data select unit 400, and similarly, the Y-pitch of a memory cell 200 may be 3, 4, 5, etc., times that of the data IO unit 500. Further, if the data select unit 400 abuts the memory cell 200 on the same row, then the pitch relationship between the memory cell 200 and the data select unit 400 is in the Y-, instead of the X-, direction. Similarly, if the memory cell 200 abuts the data IO unit 500 in the column direction, then the pitch relationship between the memory cell 200 and the data IO 500 is in the X-, instead of Y-, direction, etc.

Exemplary Method Generating a Building Block

Figure 11:
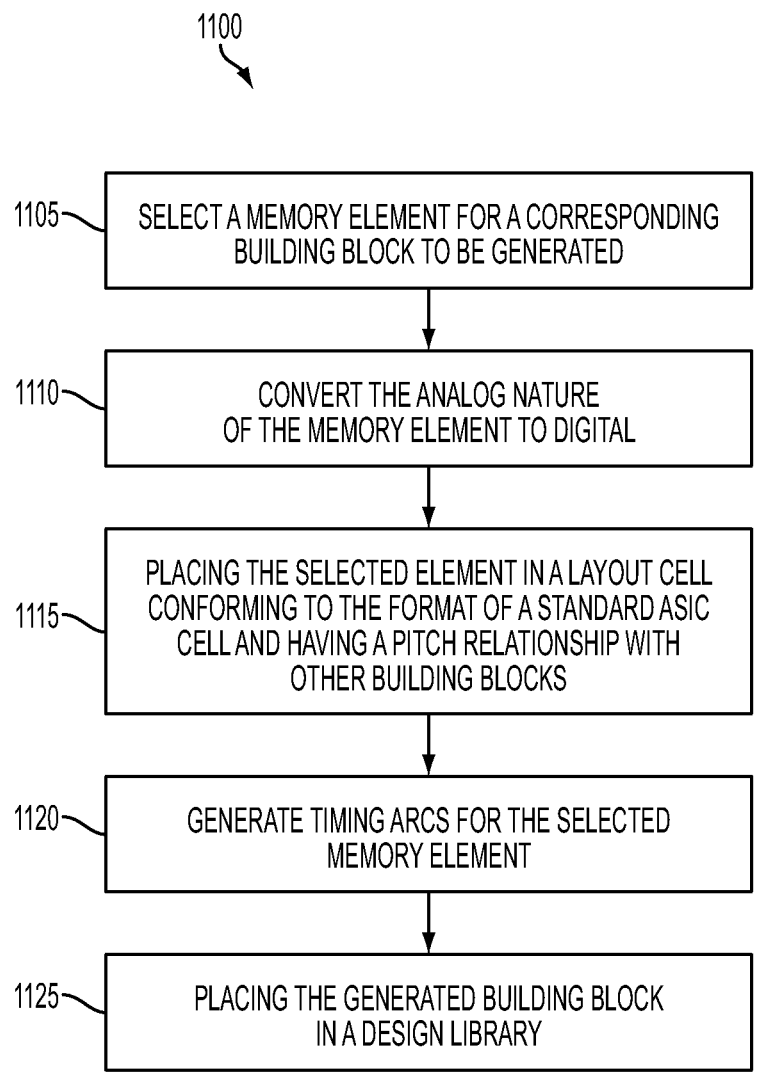
FIG. 11 shows a flowchart illustrating a method embodiment creating a building block.

FIG. 11 shows a flowchart 1100 illustrating a method embodiment for generating a building block.

In block 1105, a memory element (e.g., a data store unit or a memory cell 100, a data select unit 400, etc.) is identified so that a corresponding building block may be created. For illustration, memory cell 100 is selected.

In block 1110, the analog nature of memory cell 100 is converted to digital. For example, memory cell 100 is converted to memory cell 200 wherein the analog interface is converted to the digital interface, signals WBL and WBLB are converted to signal WD, the pass gate PG and NAND gate NA are added, etc.

In block 1115, memory cell 200 is placed in a layout cell conforming to the format of a standard ASIC cell. In this block 1115, the pitch of memory cell 200 may be adjusted to be equal to or a multiple of the pitch of a standard cell. The pitch of memory cell 200 may also be adjusted relative to the pitch of another building block (e.g., the building block for a data select unit 400 for a data IO unit 500, etc). Depending on the placement of the other building blocks relative to the orientation of memory cell 200 (e.g., abutting in the X- or Y-direction), the pitch relationship between memory cell 200 and other building blocks may be in the Y- and/or X-direction.

In block 1120, timing arcs for memory cell 200 are created, including, for example, timing arcs Aswl, Ahwl, Arwl-rbl, etc. But if the building block is for a data select unit 400, then its timing arcs including, for example, Aswlp1, Ahwlp1, Aswlp2, Aswhp2, Aahwlpl, Aahwlp1, Aaswlp2, Aahwlp2, etc., are created.

Once block 1120 is completed, a standard memory cell or a building block for memory cell 200 is created and in block 1125 may be placed in a design library for use as appropriate. Building blocks for other memory elements may be created using the example in FIG. 11 and the spirit and scope of embodiments of the disclosure as illustrated in this document.

Exemplary Method Embodiment to Design a Memory Array

Figure 12:
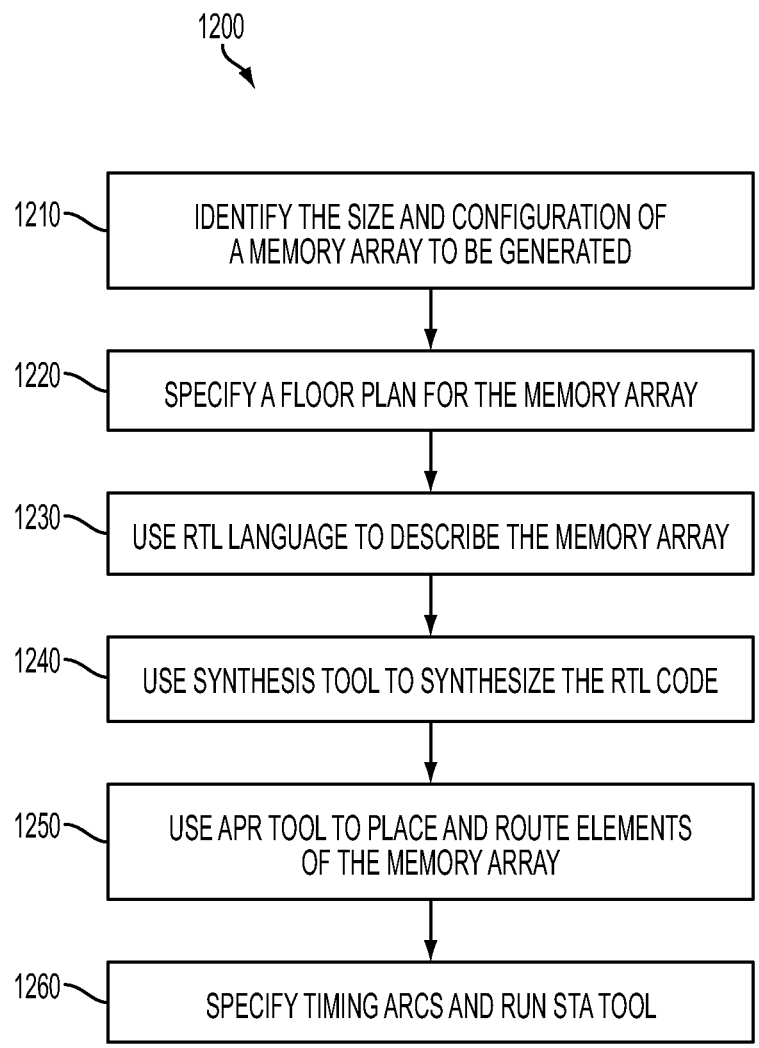
FIG. 12 shows a flowchart illustrating a method embodiment generating a memory array using the building blocks.

FIG. 12 shows a flowchart 1200 illustrating a method embodiment for generating memory array 900.

In block 1210, a design engineer identifies the size, the configuration of memory array 900, including the number of sub arrays 910 (e.g., the number of words), the number of columns in a sub array 910, and the number of memory cells 200 in a column, the global IO control, latches, etc. In memory array 900, there are 8 sub arrays 910 and thus 8 word lines, and 86 cells in a column.

In block 1220, the design engineer specifies the floor plan for memory array 900, e.g., the locations of each building block with respect to each other, including the position of the memory cells 200 with respect to a data select unit 400, a data IO unit 500, etc., the locations of global IO 920, latches 930, etc. In memory array 900 there are 43 memory cells 200 on each side of a data select unit 400, each including two read word line drivers 410 and two write word line drivers 420. Further, a data IO 500 including a NAND and a NOR abut a memory cell 200.

In block 1230 the design engineer uses RTL language to describe memory array 900. The design engineer uses truth table 300 as input to the RTL tool. The design engineer specifies the size, the configuration of memory array 900, the connections between building blocks (e.g. between memory cells 200, data select units 400, data IO units 500, etc.). The design engineer specifies the input ports of the various building blocks to be connected to the output ports of other building blocks (e.g., a memory cell 200 to an IO select unit 500, an IO select unit 500 to another IO select unit 500, a data select unit 400 to a memory cell 200, etc.). The design engineer also considers the relative pitch relationship between the building blocks, and specifies the relationship such that the synthesis tool uses the desired building blocks. In various embodiments, at this step the building blocks of different technologies have been built in a design library, and the design engineer specifies the building blocks that fit his/her particular design and/or technologies. For example, the design engineer, in the embodiment of FIG. 900, specifies a memory cell 200 having the X-pitch twice that of the data select unit 400 and the Y-pitch twice that of the data IO unit 500, etc. Depending on implementations, the design engineer can view the array 900, using the RTL tool. Knowing the building blocks' height and width, the design engineer provides the information so that APR tool can provide a proper floor plan. In memory array 900 memory cell 200 abuts data select units 400 in the column direction and abuts data TO units 500 in the row direction. As a result, the width of a memory cell 200 matches the width of a data select unit 400, and the height of a memory cell 200 matches the height of a data IO unit 500, etc. Further, the X-pitch of a memory cell 200 is twice that of a data select unit 400, etc., and the Y-pitch of a memory cell 200 is twice that of a data IO unit 500, etc.

In block 1240 the design engineer uses the synthesis tool to synthesize the RTL code and to create a netlist file. In effect, the synthesis tool recognizes the logic relationship defined in the RTL and selects the appropriate building blocks.

In block 1250 the design engineer runs the APR tool.

In block 1260, the design engineer specifies the timing constraints in terms of the timing arcs for memory array 900 and provides the information in a timing file to run the STA tool. If memory array 900 passes the timing constraints, then memory array 900 is generated as appropriate. If, however, memory array 900 does not pass the timing constraint, the design engineer adjusts the timing arcs until memory array 900 passes.

A number of embodiments of the disclosure have been described. It will nevertheless be understood that various modifications may be made without departing from the spirit and scope of the invention. For example, the configuration and size of memory array 900 are for illustration purposes only, various embodiments are applicable in various other configurations and sizes. The pitch relationship and the relative position between the building blocks and other circuitry in this document are also for illustration, other pitch relationships are within scope of embodiments of the disclosure. Pass gate PG and NAND gate NA illustrate an embodiment, but compatible digital devices and/or circuits may be generated and are within scope of embodiments of the disclosure. For example a NAND may be implemented as an AND and an inverter, etc. The method embodiments were described with exemplary steps, but performing these steps does not necessarily require the order as explained. Steps may be added, replaced, changed order, and/or eliminated as appropriate, in accordance with the spirit and scope of embodiments of the disclosure. Each claim of this document constitutes a separate embodiment, and embodiments that combine different claims and/or different embodiments are within the scope of the disclosure and will be apparent to those skilled in the art after reviewing this document.

What is claimed is:

1. A method comprising:
   converting, by using a computer, a first memory element to a second memory element, the first memory element having an analog output interface, and the second memory element having a digital interface, and functionality of the first memory element and the second memory element are compatible, wherein
   the analog output interface of the first memory element comprises analog devices and is configured to set an output port of the first memory element at either a first logic state or a high-impedance state; and
   the digital interface of the second memory element comprises digital devices and is configured to set an output port of the second memory element at either the first logic state or a second logic state;
   generating a layout cell for the second memory element, the layout cell having a layout pitch recognizable by a synthesis tool and a place and route tool;
   generating timing arcs for the second memory element, the timing arcs being recognizable by the place and route tool and a timing analysis tool; and
   using the second memory element in conjunction with a register level transfer tool, the synthesis tool, the place and route tool, and the timing analysis tool to automatically generate a memory, by using a computer.

2. The method of claim 1, wherein the analog interface of the first memory element includes a pull-low transistor and a switch coupled to the pull-low transistor, and the digital interface of the second memory element includes a logic gate.

3. The method of claim 1, wherein the layout pitch of the layout cell is the same as or a multiple of a layout pitch of a standard cell.

4. The method of claim 1, wherein the timing arcs include a setup and hold timing arc with reference to a write signal, a delay timing arc with reference to a read signal, and a delay arc with reference to a clock signal.

5. The method of claim 1, further comprising a third memory element having a layout pitch related to the layout pitch of the second memory element.

6. A method comprising:
   receiving, by a computer, a library having information including:
   a standard cell recognizable by a synthesis tool and a place and route tool, the standard cell having a standard cell layout pitch;
   a memory cell having a digital interface comprising digital devices and configured to set an output port of the memory element at either a first logic state or a second logic state, the memory cell having a memory cell layout pitch, wherein
   the memory cell is converted from a memory element having an analog output interface; and
   the analog output interface of the memory element comprises analog devices and is configured to set an output port of the memory element at either the first logic state or a high-impedance state;
   a data select unit having a digital interface and a data select layout pitch; and
   a data IO unit having a digital interface and an IO layout pitch, each of the memory cell layout pitch, the data select layout pitch, and the IO layout pitch being equal to or a multiple of the standard cell layout pitch; and using the memory cell, the data select unit, and the data IO unit in conjunction with a register transfer level tool, the synthesis tool, the place and route tool, and a timing analysis tool to generate a memory, by using a computer.

7. The method of claim 6, wherein the digital interface of the memory cell includes a logic gate.

8. The method of claim 6, wherein each of the data select layout pitch and the IO layout pitch is related to the memory cell layout pitch.

9. The method of claim 6, wherein the memory cell layout pitch, the data select layout pitch, and the IO layout pitch are related based on a configuration of a memory array being generated using the memory cell, the data select unit, and the data IO unit.

10. The method of claim 6, wherein the memory cell layout pitch is a multiple of the data select layout pitch.

11. The method of claim 6, wherein the memory cell layout pitch is a multiple of the data IO layout pitch.

12. The method of claim 6, further comprising receiving information regarding timing arcs for the memory cell, the timing arcs being recognizable by the place and route tool and the timing analysis tool.

13. The method of claim 6, further comprising receiving information regarding one or a combination of a setup and a hold timing arc with reference to a write signal, a delay timing arc with reference to a read signal, and a delay timing arc with reference to a clock signal.

14. A method comprising:
generating, by using a computer, a layout cell for a memory element, the layout cell being recognizable by one or more ASIC design tools, the memory element having a digital output interface, the memory element being converted from another memory element having an analog output interface, wherein
the analog output interface of the another memory element comprises analog devices and is configured to set an output port of the another memory element at either a first logic state or a high-impedance state; and
the digital interface of the memory element comprises digital devices and is configured to set an output port of the memory element at either the first logic state or a second logic state, and
the generating the layout cell for the memory element comprising generating layout patterns for:
a storage device configured to store data; and
a logic gate having a first input terminal, a second input terminal, and an output terminal, the first input terminal of the logic gate being coupled to the storage device, the second input terminal of the logic gate being coupled to a read word line signal, and the output terminal of the logic gate being usable as the output port of the memory element; and
generating timing arcs for the memory element, the timing arcs being recognizable by the one or more ASIC design tools.

15. The method of claim 14, wherein the generating the layout patterns is further performed for:
a switch device configured to selectively apply write data to the storage device.

16. The method of claim 14, wherein the generating the layout patterns comprises generating layout patterns for:
a first inverter of the storage device, the first inverter having an input terminal and an output terminal, the input terminal of the first inverter coupled to a first node, and the output terminal of the first inverter coupled to a second node; and
a second inverter of the storage device, the second inverter having an input terminal and an output terminal, the input terminal of the second inverter coupled to the second node, and the output terminal of the second inverter coupled to the first node.

17. The method of claim 14, wherein the generating the layout patterns is further performed for:
a write data line;
a write word line; and
a complementary write word line,
a pass gate coupled between the storage device and the write data line and configured to be controlled by a signal on the write word line and a signal on the complementary write word line.

18. The method of claim 14, wherein a layout pitch of the layout cell is the same as or a multiple of a layout pitch of a standard cell.

19. The method of claim 14, wherein the timing arcs include a setup and hold timing arc with reference to a write signal, a delay timing arc with reference to a read signal, and a delay arc with reference to a clock signal.

20. The method of claim 14, wherein the logic gate comprises a NAND gate.

* * * * *